United States Patent
Aurongzeb et al.

(10) Patent No.: US 11,437,967 B2
(45) Date of Patent: Sep. 6, 2022

(54) INFORMATION HANDLING SYSTEM DYNAMIC SPEAKER VOLUME

(71) Applicant: Dell Products L.P., Round Rock, TX (US)

(72) Inventors: Deeder M. Aurongzeb, Austin, TX (US); Allen B. McKittrick, Cedar Park, TX (US); Weijong Sheu, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 106 days.

(21) Appl. No.: 17/023,775

(22) Filed: Sep. 17, 2020

(65) Prior Publication Data

US 2022/0085780 A1 Mar. 17, 2022

(51) Int. Cl.
| | |
|---|---|
| H03G 3/30 | (2006.01) |
| H04R 1/02 | (2006.01) |
| H04R 1/28 | (2006.01) |
| G06F 1/20 | (2006.01) |
| H05K 7/20 | (2006.01) |

(52) U.S. Cl.
CPC .......... *H03G 3/3005* (2013.01); *G06F 1/203* (2013.01); *H04R 1/02* (2013.01); *H05K 7/20172* (2013.01); *H04R 1/2811* (2013.01); *H04R 2499/11* (2013.01); *H04R 2499/15* (2013.01)

(58) Field of Classification Search
CPC .. H03G 3/3005; H05K 7/20172; G06F 1/203; H04R 1/02; H04R 1/2811; H04R 2499/11; H04R 2499/15

USPC ........ 381/303, 305, 345, 395, 306, 333, 388
See application file for complete search history.

(56) References Cited

U.S. PATENT DOCUMENTS

| | | | |
|---|---|---|---|
| 8,369,561 B2 | 2/2013 | Bhutani et al. | |
| 8,644,519 B2 | 2/2014 | Pance et al. | |
| 9,154,869 B2 | 10/2015 | Cohen et al. | |
| 9,516,406 B2 | 12/2016 | Fromel et al. | |
| 9,654,863 B2 | 5/2017 | Crosby et al. | |
| 2007/0029131 A1* | 2/2007 | Pan | H04R 1/2803 181/148 |
| 2010/0210327 A1* | 8/2010 | Kim | H04M 1/035 381/345 |
| 2012/0063626 A1* | 3/2012 | Peng | H04R 1/2803 381/345 |
| 2015/0049895 A1* | 2/2015 | Walter | H04R 1/2811 381/345 |
| 2020/0322714 A1* | 10/2020 | Alva | G06F 1/1656 |

* cited by examiner

*Primary Examiner* — Xu Mei

(74) *Attorney, Agent, or Firm* — Zagorin Cave LLP; Robert W. Holland

(57) ABSTRACT

An information handling system housing forms an audio chamber within which a speaker generates audible noise based upon audible information. An adaptive material, such as an electroactive polymer, is disposed at an opening formed in the audio chamber to selectively expand to increase the audio chamber size and contract to decrease the audio chamber size. An increased audio chamber volume enhances audible noise, such as music or audio associated with audiovisual content. A decrease audio chamber can improve airflow within the housing, such as during times of thermal stress.

19 Claims, 6 Drawing Sheets

INFORMATION HANDLING SYSTEM DYNAMIC SPEAKER VOLUME

BACKGROUND OF THE INVENTION

Field of the Invention

The present invention relates in general to the field of portable information handling systems, and more particularly to an information handling system dynamic speaker volume.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Portable information handling systems integrate processing components, a display and a power source in a portable housing to support mobile operations. Portable information handling systems allow end users to carry a system between meetings, during travel, and between home and office locations so that an end user has access to processing capabilities while mobile. Tablet configurations typically expose a touchscreen display on a planar housing that both outputs information as visual images and accepts inputs as touches. Convertible configurations typically include multiple separate housing portions that couple to each other so that the system converts between closed and open positions. For example, a main housing portion integrates processing components and a keyboard and rotationally couples with hinges to a lid housing portion that integrates a display. In a clamshell configuration, the lid housing portion rotates approximately ninety degrees to a raised position above the main housing portion so that an end user can type inputs while viewing the display. After usage, convertible information handling systems rotate the lid housing portion over the main housing portion to protect the keyboard and display, thus reducing the system footprint for improved storage and mobility.

Generally, end users prefer portable information handling systems that have a minimal footprint and weight. Typically, the end user selects a portable information handling system based upon display size, which defines the length and width of the housing that integrates the display. In order to reduce the system footprint and weight, information handling system manufactures generally attempt to limit housing thickness. Low profile housings can create a number of difficulties for the placement of processing components within the housing. For example, minimal housing thickness limits room available for air to flow through the housing for rejection of excess thermal energy from the housing due to dissipation of power through the processing components, such as the central processing unit (CPU). Some information handling systems include cooling fans that generate an airflow within the housing to actively remove excess thermal energy. Such active thermal transfer systems can generate a variable airflow speed based upon temperatures sensed within the housing. Other information handling systems rely upon passive thermal transfer that generally exposes internal air to cooler external air through vents. If temperatures exceed operating thresholds, processing components are typically throttled to operate on less power so that less excess thermal energy is generated. A difficulty with this approach is that lower operating speeds tend to impact system performance and the end user's experience.

Often, end user's interact with information handling systems through audible feedback output by speakers integrated in the housing. In some instances, audible output need only have a moderate quality, such as to output notifications that draw an end user's attention like upon receipt of an email. In many instances, end users expect high quality audio output, such as when playing audiovisual content like movies or playing music. One problem with audio quality provided by portable information handling systems is that better quality speakers tend to have a larger size that does not fit well in a low profile housing. Even lower profile speakers, such as piezoelectric speakers, tend to produce lower quality sound when placed in a minimal volume area of a housing.

SUMMARY OF THE INVENTION

Therefore, a need has arisen for a system and method which provides speaker integration in portable information handling system to provide high quality audio output.

In accordance with the present invention, a system and method are provided which substantially reduce the disadvantages and problems associated with previous methods and systems for generating audio output at an information handling system. An information handling system audio chamber having a speaker to output audible sounds selectively adjusts the audio chamber volume to adapt sound quality based upon one or more predetermined conditions, such as a type of sound output by the speaker.

More specifically, a portable information handling system processes information with processing components disposed in a portable housing, such as a CPU that executes instructions and a memory that stores the instructions and information. A speaker is disposed in an audio chamber having a volume defined by the housing and exposed at one side with an opening. An adaptive material, such as an electroactive polymer, covers the opening and interfaces with a processing element, such as an embedded controller, that selectively activates the adaptive material to expand and thereby increase the size of the audio chamber. For example, the adaptive material covers an opening at a cover housing portion that forms a palm rest of the information handling system so that activation of the adaptive material forms an expanded audio chamber within the palm rest.

The present invention provides a number of important technical advantages. One example of an important technical advantage is that an audio chamber volume expands and contracts to adapt to a type of audio output at the speaker.

The expanded volume is provided at the system palm rest so that contracting the audio chamber volume provides a flat surface at the cover housing portion for bringing the housing to a closed position. Selective expansion of the adaptive material supports high quality audio playback when desirable, such as when musical content or move audiovisual content is presented, while permitting a low profile housing when high quality audio is not needed, such as in association with application notifications or other audio output. In one alternative embodiment, the audio chamber expands within the housing so that increased airflow impedance can result and thermal management logic contracts the audio chamber if a thermal threshold is met.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

An information handling system audio chamber adjusts between first and second volumes by expanding and contracting an adaptive material. For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Figure 1:
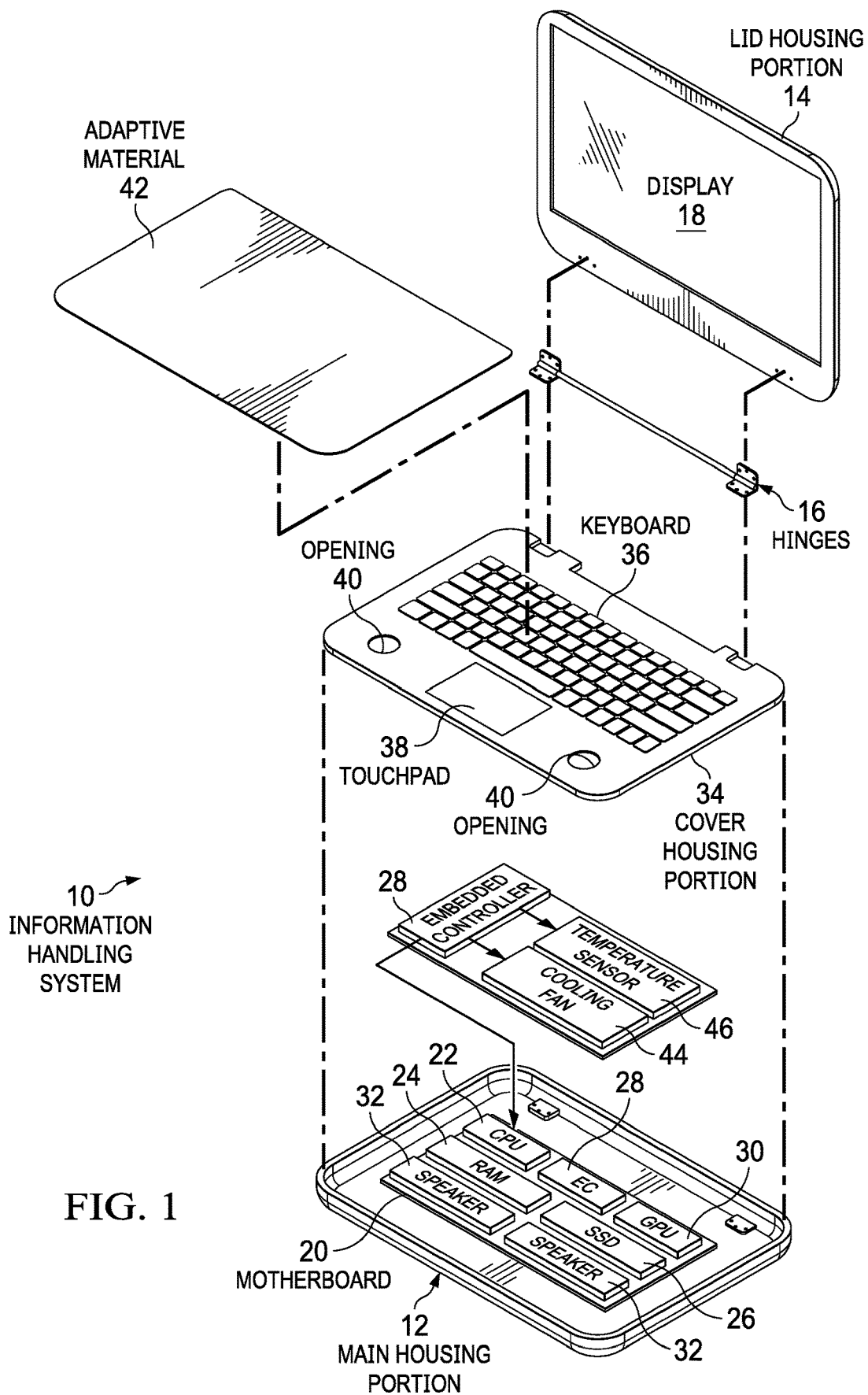
FIG. 1 depicts an exploded view of a portable information handling system 10 having a variable volume audio chamber.

Referring now to FIG. 1, an exploded view depicts a portable information handling system 10 having a variable volume audio chamber. In the example embodiment, portable information handling system 10 has a main housing portion 12 rotationally coupled to a lid housing portion 14 by a hinge 16 to rotate between open and closed positions. In the open position as depicted, lid housing portion 14 holds an integrated display 18 in a viewing position over the top of main housing to present information to an end user as visual images. Main housing portion 12 contains processing components that cooperate to process information. For instance, a motherboard 20 couples to main housing portion 12 and integrates wirelines that provide communication between the processing components. A central processing unit (CPU) 22 executes instructions to process information with the instructions and information stored in a random access memory (RAM) 24. For example, an operating system and applications stored in persistent memory of a solid state drive (SSD) 26 are retrieved at power up to RAM 24 for execution by CPU 22. A graphics processing unit (GPU) 30 is provided with the information to generate pixel values that define visual images for presentation at display 18. An embedded controller 28 interfaces with CPU 22 and manages physical conditions within the system, such as application of power and internal thermal conditions. First and second speakers integrate in the front portion of main housing portion 12 and interface with CPU 22 to present information as audible sounds.

Speakers 32 generate sound in part by having the sounds amplified within an audio chamber defined by main housing portion 12 and a cover housing portion 34 that couples over main housing portion 12. Cover housing portion 34 supports a keyboard 36 at an upper surface to accept keyed inputs from an end user and a touchpad 38 that accepts touch inputs to control a pointer at display 18 similar to a mouse. The area around touchpad 38 is typically referred to as a palm rest where an end user's palm rests while typing at keyboard 36. First and second openings 40 are formed in cover housing portion 34 at the position of first and second speakers 32 and in communication with the audio chamber defined in main housing portion 12 for each speaker 32. An adaptive material 42 couples over cover housing portion 34 to close off openings 40. For example, adaptive material 42 is an electroactive polymer that adapts between an expanded and a contracted shape by the application of an electric current. For instance, adaptive material 42 may be a dielectric type, such as a ferroelectric polymer, electrostrictive graft polymer or a liquid crystalline polymer, or may be an ionic type, such as an electroheological fluid, an ionic polymer-metal composite or a stimuli responsive gel. As another example, adaptive material 42 may be a voltage controlled dielectric elastomer, such as is described by Hajiesmaili et al. in Extreme Mechanics Letter, Volume 30, July 2019, available on the Internet at https://www.sciencedirect.com/science/article/abs/pii/S2352431619300483. Embedded controller 28 interfaces with adaptive material 42 to selectively apply a current that expands adaptive material 42 and remove the current to retract adaptive material 42. When expanded, adaptive material 42 separates from cover housing portion 34 to create a gap in communication with each opening 40 to effectively increase the volume of the audio chamber defined with in main housing portion 12. When contracted, adaptive material 42 reduces the height of main housing portion 12, such as to reduce system thickness when lid housing portion 14 closes shut.

Embedded controller 28 controls the volume of the audio chamber by applying and removing current at adaptive material 42 based upon a variety of different conditions. For instance, CPU 22 may request an enlarged audio chamber volume based upon a type of audio information that is presented at speakers 32. For example, an operating system audio driver may command an expanded audio chamber volume when higher quality audio is played, such as based upon the audio bit rate, the application playing audio, and/or the type of file from which the audible sounds are generated.

For example, an audiovisual file associated with playing a movie or music may have an enhanced audio chamber volume to provide higher quality sound. In contrast, applications that do not need higher quality sound may maintain the smaller audio chamber volume, such as during a video conference or when playing notifications relating to email, texts, or other application events that are played as beeps or brief musical tones. In some instances, the audio chamber volume may expand within main housing portion 12 so that cooling airflow generated by a cooling fan 44 is impeded from passing across CPU 22 to aid in rejection of excess thermal energy. In such circumstances, embedded controller 28 may override a command to expand the audio chamber volume where a temperature sensor 46 detects an elevated thermal state, such as threshold temperature. In various embodiments, firmware instructions stored in non-transitory memory of embedded controller 28 execute on embedded controller 28 to manage thermal conditions and fan speed based upon the audio chamber volume setting as expanded or contracted by adaptive material 42. In some situations, reduced fan noise provided by reduced fans speed associated with improved cooling airflow may provide a better sound experience than an enlarged audio chamber. Further, a lower speaker setting may be achieved by increasing speaker output where a low audio chamber volume is selected. That is, speaker output can adapt to provide an expected sound level depending upon whether or not the enlarged audio chamber volume is available.

Figure 2A:
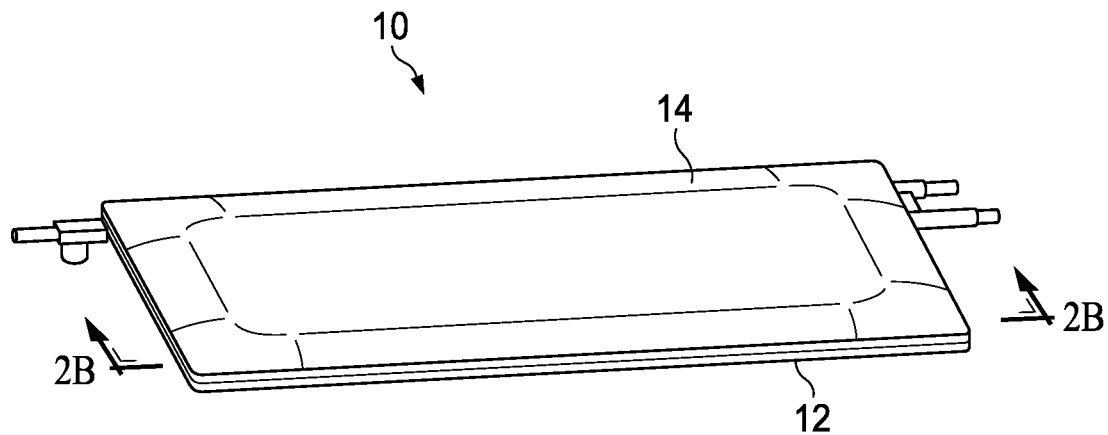
FIGS. 2A, 2B, 2C, 2D and 2E depict a portable information handling system with an audio chamber having a compressed configuration and an expanded configuration.
Figure 2B:
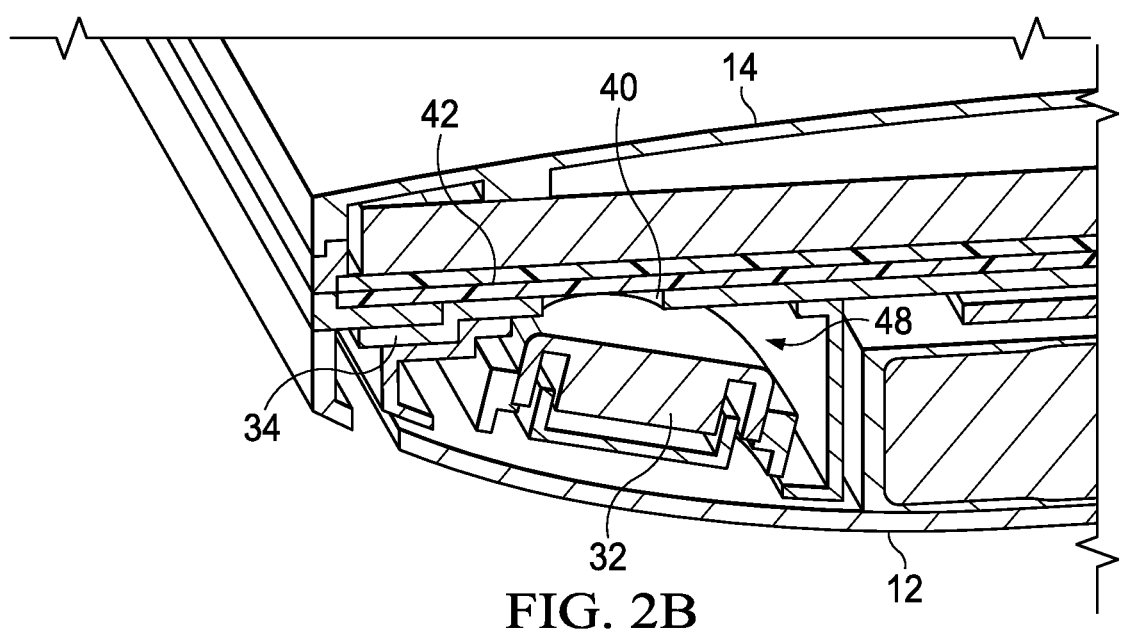
Figure 2C:
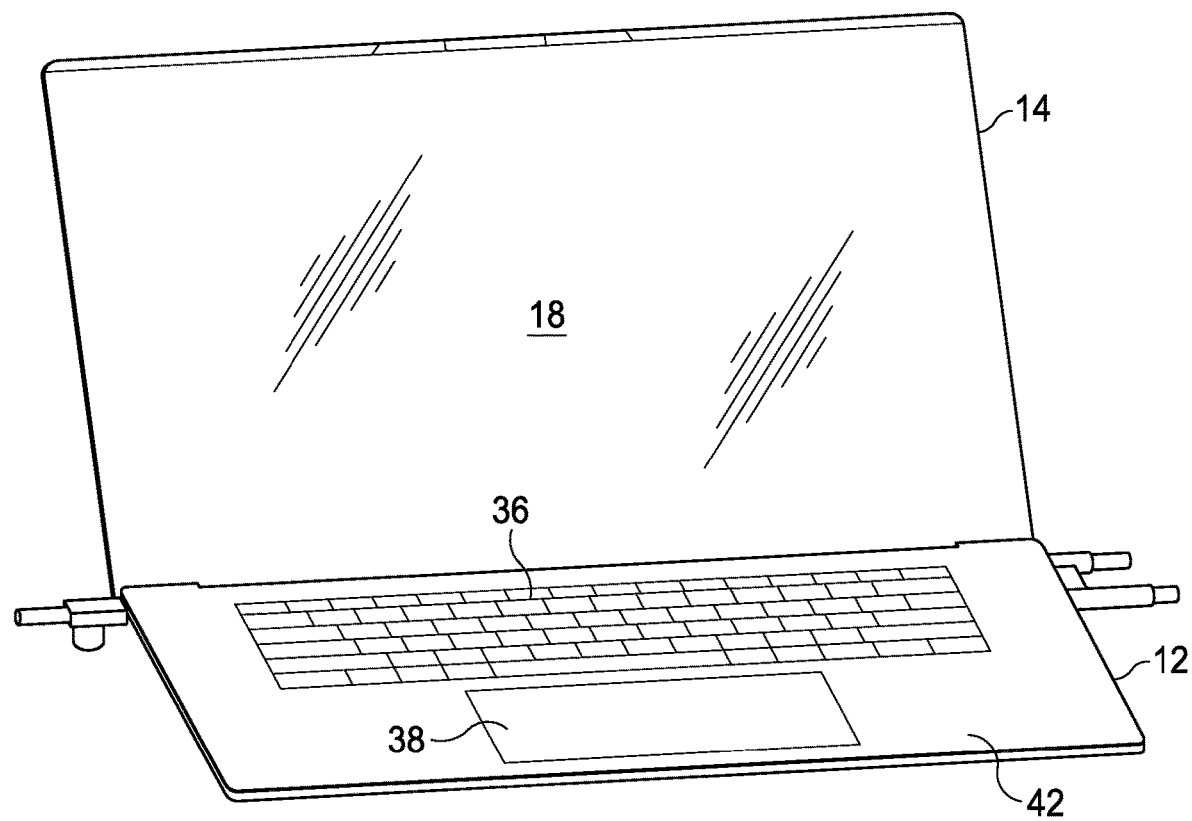
Figure 2D:
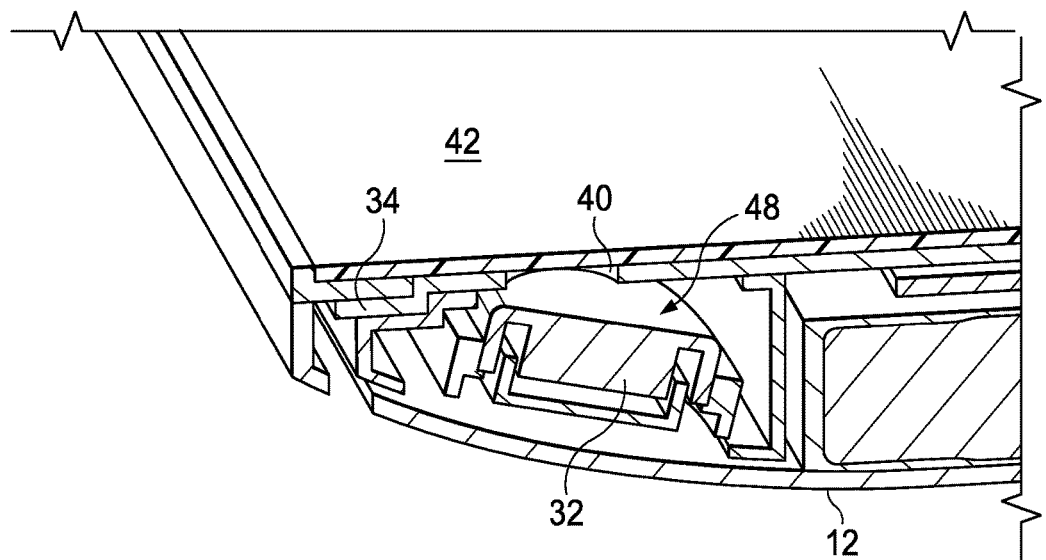
Figure 2E:
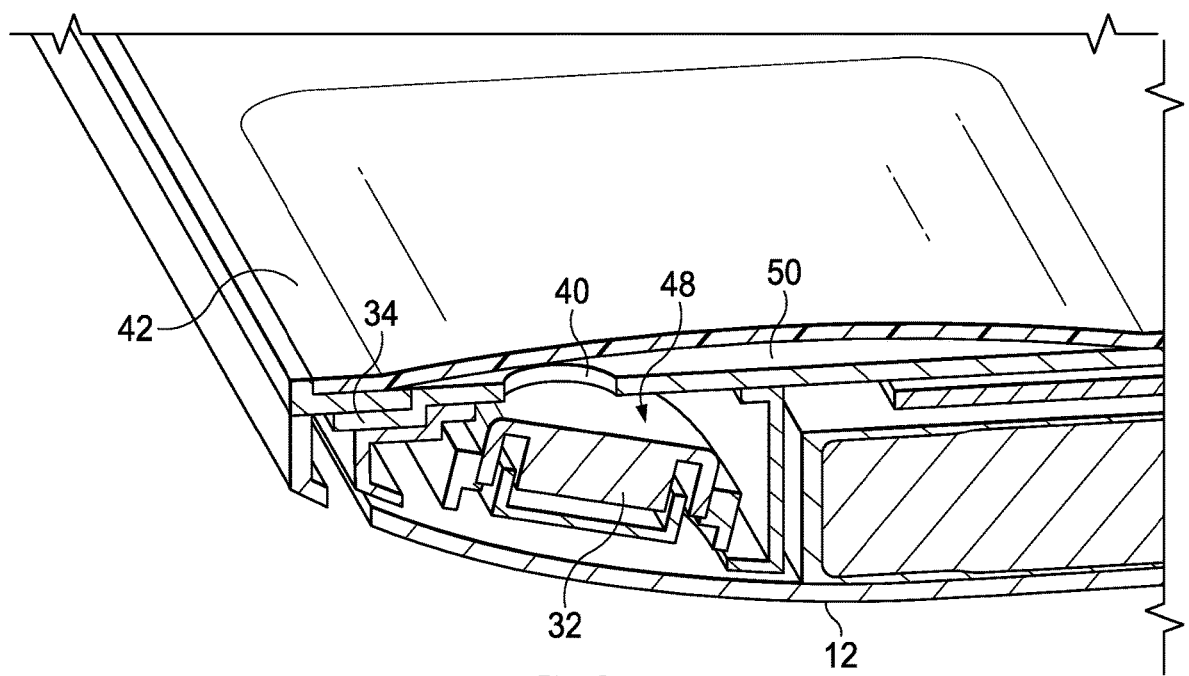

Referring now to FIG. 2A through 2E, portable information handling system 10 is depicted with an audio chamber 48 having a compressed configuration and an expanded configuration. FIG. 2A depicts portable information handling system 10 in a closed position having lid housing portion 14 rotated against main housing portion 12 to provide a relatively thin footprint for improved portability. FIG. 2B depicts portable information handling system 10 at the cross sectional cut line to illustrate that system thickness is minimized by having lid housing portion 14 close into close proximity with main housing portion 12. Speaker 32 is depicted disposed in an audio chamber 48 defined within main housing portion 12. Cover housing portion 34 defines an upper surface of audio chamber 48 and aligns opening 40 with the audio chamber to provide a passage for sound energy up and out of audio chamber 48. In the depicted closed configuration, adaptive material 42 has a compressed configuration that closes off opening 40 and restricts the size of audio chamber 48 to the approximately 5 cc defined within main housing portion 12. FIG. 2C depicts lid housing portion 14 rotated to an open position having display 18 raised for viewing above main housing portion 12. As shown by FIGS. 2C and 2D, adaptive material 42 provides an upper surface over cover housing portion 34 while audio chamber 48 remains with a default low volume as defined within main housing portion 12. In the depicted state, audio is provided without the benefit of enhanced audio chamber volume, such as for notification audio information or other audio information that requires less quality and/or volume. FIG. 2E depicts portable information handling system 10 having adaptive material 42 activate to expand up and away from the surface of cover housing portion 34 to form an expanded audio chamber 50. The increased volume of the total audio chamber as provided by the internal audio chamber 48 and the expanded audio chamber 50 provides a higher quality sound with improved volume. Expanded audio chamber 50 presses up in a flexible manner that is largely imperceptible by an end user and compresses back again cover housing portion 34 when the system closes to provide the thin profile of FIG. 2A that enhances portability. Although the example embodiment depicts a single opening 40 in the cover housing portion, alternative embodiments may have multiple openings of different sizes as desired to maintain cover housing portion 34 strength. Additional volume may be provided along the interior surface of audio chamber 48 that expands internally within main housing portion 12.

Figure 3A:
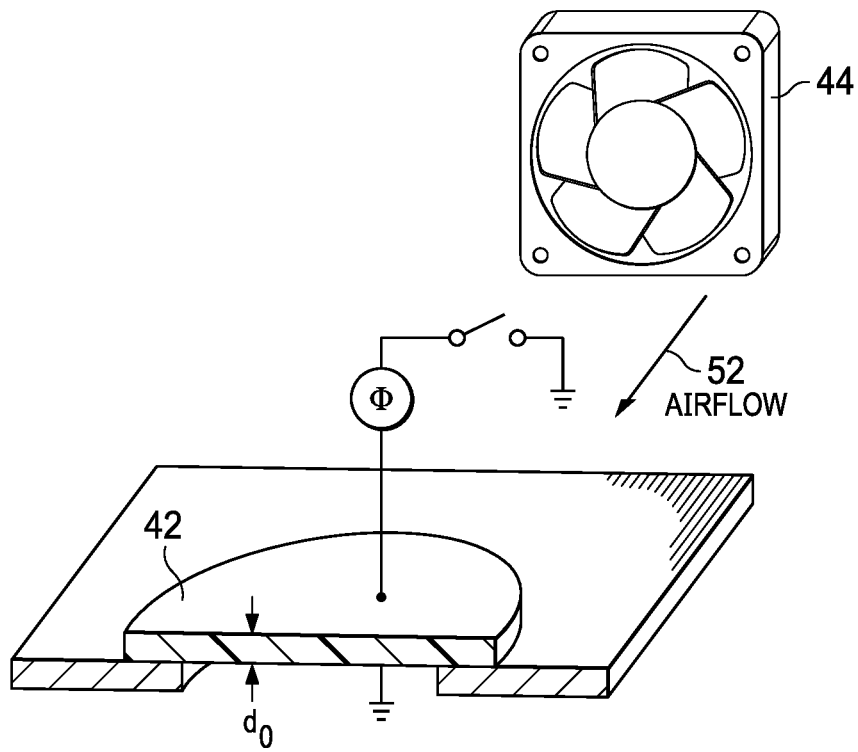
FIGS. 3A and 3B depict an example embodiment of adjustment of an internal audio chamber volume based upon a housing thermal state.
Figure 3B:
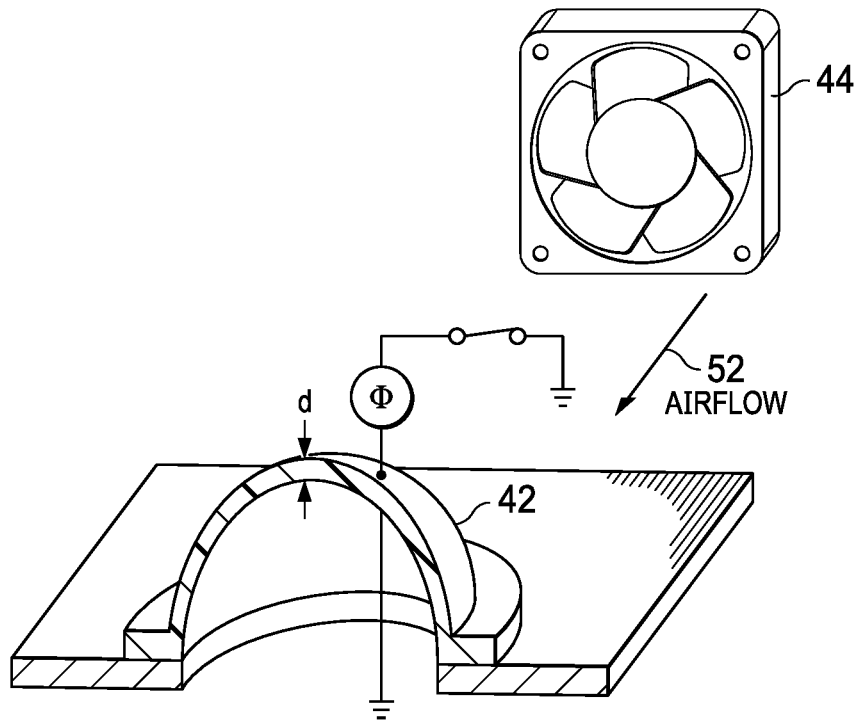

Referring now to FIGS. 3A and 3B, an example embodiment depicts adjustment of an internal audio chamber volume based upon a housing thermal state. FIG. 3A depicts adaptive material 42 in a contracted configuration that allows airflow 52 to pass by unimpeded so that a reduced airflow pressure provides sufficient thermal rejection to maintain a desired thermal state within the main housing portion. FIG. 3B depicts adaptive material 42 in an expanded configuration that projects increased audio chamber volume into airflow 52 to provide improved audio quality, such as when presenting audible sounds associated with a movie or other type of content as desired by an end user. In the event that the expanded audio chamber is in use and an excessive thermal state is detected, such as at a threshold temperature, adaptive material 42 may be commanded to the compressed state to improve airflow 52 by reducing airflow impedance within the housing. Where adaptive material 42 is disposed within the housing, the expanded state may be used as a default so that improved audio is available for all audio information while the compressed state is commanded if thermal conditions become excessive. Alternatively, the compressed state may be used as the default so that noise associated with airflow is reduced, such as by running the cooling fan at a reduced speed.

Figure 4:
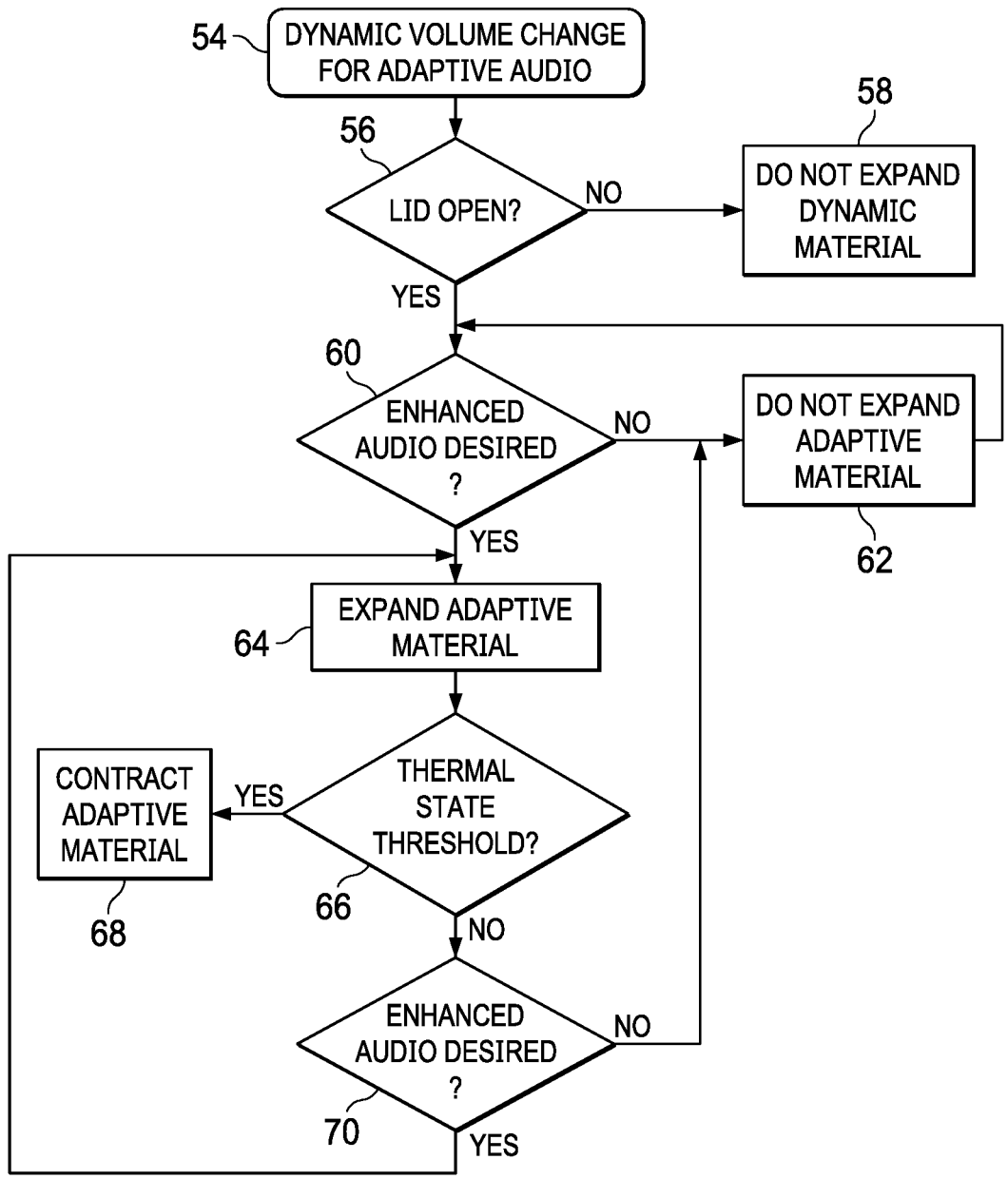
FIG. 4 depicts a flow diagram of a process for adapting an audio chamber volume based upon audio type.

Referring now to FIG. 4, a flow diagram depicts a process for adapting an audio chamber volume based upon audio type. The process starts at step 54 with initiation of logic that manages speaker audible output, such as with initiation of an audio driver of an operating system executing on the information handling system during power up. At step 56, a determination is made of whether the housing lid portion is open. If not, the process continues to step 58 to maintain the adaptive material in the compressed state, such as its default state at system power up. If the lid housing portion is open, the process continues to step 60 to determine if enhanced audio is desired, such as based upon applications executing on the system or the type of audio played by the speakers. For example, if a multi-media player application is open, enhanced audio may be set up even if the audible sounds are not yet played. Alternatively, if an audible file is being played, enhanced audio may be desired based upon the type of audio being presented, such as a movie or stereo sound file. If enhanced audio is not desired, the process continues to step 60 at which the adaptive material maintains a contracted state for an audio chamber of reduced size. If at step 60 enhanced audio quality is desired, the process continues to step 64 to expand the adaptive material for an audio chamber of increased size. Once the increased audio chamber is activated, the process continues to step 66 to monitor the thermal state of the information handling system provided the adaptive material expanded state impedes cooling airflow in the housing. If a thermal threshold is detected, such as a defined temperature, the process continues to step 68 to contract the adaptive material and improve system cooling, then returns to step 66 to continue monitoring the thermal state. If at step 66 the thermal state is below the threshold, the adaptive material maintains the expanded state and the process continues to step 70 to determine if enhanced audio remains desired. If so the process returns to step 64 to continue with enhanced audio. If enhanced audio is no longer desired, such as due to closing of a multi-media application, the process returns to step 62 to contract the adaptive material.

Although the present invention has been described in detail, it should be understood that various changes, substitutions and alterations can be made hereto without departing from the spirit and scope of the invention as defined by the appended claims.

What is claimed is:

1. An information handling system comprising:
a housing having an audio chamber;
a processor disposed in the housing and operable to execute instructions to process information;
a memory disposed in the housing and interfaced with the processor, the memory operable to store the instructions and information;
a speaker disposed in the audio chamber and interfaced with the processor to apply the information to create audible sounds; and
an adaptive material disposed proximate the audio chamber and interfaced with the processor, the adaptive material selectively expanding and contracting based upon one or more predetermined conditions to adjust a volume of the audio chamber.

2. The information handling system of claim 1 wherein the one or more conditions comprise audio presentation of a first or a second audio quality, the first audio quality associated with expanding the adaptive material, the second audio quality associated with contracting the adaptive material.

3. The information handling system of claim 2 wherein the first audio quality comprises an audiovisual video playback and the second audio quality comprises a notification alert.

4. The information handling system of claim 1 wherein the one or more predetermined conditions comprises a thermal state within the housing, the adaptive material contracting above a predetermined temperature threshold.

5. The information handling system of claim 1 wherein the adaptive material comprises an electroactive polymer.

6. The information handling system of claim 5 wherein the housing comprises a palm rest having an opening to the audio chamber, the adaptive material disposed to cover the opening when contracted and to define an expansion of the audio chamber over the palm rest when expanded.

7. The information handling system of claim 5 further comprising:
a cooling fan aligned to provide a cooling airflow from an intake to a vent and past the processor;
wherein the adaptive material extends within the housing to at least partially block the cooling airflow and retracts out of the cooling airflow.

8. The information handling system of claim 5 wherein the electroactive polymer comprises a dielectric material.

9. The information handling system of claim 5 wherein the electroactive polymer comprises an ionic material.

10. A method for presenting audio at an information handling system, the method comprising:
generating audio information with a processor disposed in a housing;
presenting the audio information as audible sounds with a speaker disposed in an audio chamber defined within the housing; and
adjusting the audio chamber to have a first or second volume in response to a predetermined condition, the second volume greater than the first volume;
wherein the adjusting the audio chamber further comprises:
defining an opening in the audio chamber;
covering the opening of the audio chamber with an electroactive polymer
activating the electroactive polymer to expand when adjusting the audio chamber volume to the second volume; and
deactivating the electroactive polymer to contract when adjusting the audio chamber volume to the first volume.

11. The method of claim 10 wherein the predetermined condition comprises a type of audio information, the method further comprising:
monitoring the type associated with the audio information;
adjusting the audio chamber to the first volume when a first type of audio information is monitored; and
adjusting the audio chamber to the second volume when a second type of audio information.

12. The method of claim 11 wherein the first audio type comprises a notification and the second audio type comprises audiovisual content, the method further comprising:
defaulting to the first audio type when no audio information is presented.

13. The method of claim 11 wherein the predetermined condition further comprises a thermal state in the housing, the method further comprising:
monitoring the thermal state within the housing; and
adjusting from the second volume to the first volume when the thermal state exceeds a threshold.

14. The method of claim 10 wherein the covering the opening further comprises disposing the opening at a palm rest of the information handling system housing, the audio chamber second volume expanded at an upper side of the palm rest.

15. A speaker assembly comprising:
a housing having an outer surface and an inner surface, the inner surface forming a speaker chamber having an opening to the outer surface;
a speaker disposed in the housing and operable to generate audible noise;
an adaptive material disposed over the opening, the adaptive material having a contracted configuration closes off the opening and an expanded configuration that exposes the opening to a volume created between the housing outer surface and adaptive material; and
non-transient memory storing instructions that when executed on a processor commands the adaptive material to expand and contract based upon one or more predetermined conditions.

16. The speaker assembly of claim 15 wherein the adaptive material comprises an electroactive polymer.

17. The speaker assembly of claim 16 wherein the one or more predetermined conditions comprises a type of audible information applied to generate the audible noise.

18. The speaker assembly of claim 17 wherein the type of audible information comprises an audiovisual movie and the instructions command the adaptive material to expand.

19. The speaker assembly of claim 16 wherein the one or more predetermined conditions comprises a thermal state within the housing.

* * * * *